(12) United States Patent
Kondo et al.

(10) Patent No.: US 11,512,993 B2
(45) Date of Patent: Nov. 29, 2022

(54) VALVE DEVICE, ADJUSTMENT INFORMATION GENERATING METHOD, FLOW RATE ADJUSTING METHOD, FLUID CONTROL SYSTEM, FLOW RATE CONTROL METHOD, SEMICONDUCTOR MANUFACTURING SYSTEM AND SEMICONDUCTOR MANUFACTURING METHOD

(71) Applicant: FUJIKIN INCORPORATED, Osaka (JP)

(72) Inventors: Kenta Kondo, Osaka (JP); Toshihide Yoshida, Osaka (JP); Hidenobu Sato, Osaka (JP); Tomohiro Nakata, Osaka (JP); Tsutomu Shinohara, Osaka (JP); Masahiko Takimoto, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 387 days.

(21) Appl. No.: 16/647,569

(22) PCT Filed: Sep. 11, 2018

(86) PCT No.: PCT/JP2018/033583
§ 371 (c)(1),
(2) Date: Mar. 16, 2020

(87) PCT Pub. No.: WO2019/059040
PCT Pub. Date: Mar. 28, 2019

(65) Prior Publication Data
US 2020/0278234 A1 Sep. 3, 2020

(30) Foreign Application Priority Data

Sep. 25, 2017 (JP) .............................. JP2017-183556

(51) Int. Cl.
*G01F 15/00* (2006.01)
*F16K 31/00* (2006.01)
(Continued)

(52) U.S. Cl.
CPC .......... *G01F 15/005* (2013.01); *F16K 31/007* (2013.01); *G01F 11/006* (2013.01);
(Continued)

(58) Field of Classification Search
CPC .... F16K 31/007; F16K 31/047; F16K 31/122; F16K 31/48; F16K 7/16; F16K 7/12;
(Continued)

(56) References Cited

U.S. PATENT DOCUMENTS 5,911,238 A * 6/1999 Bump .................... G01F 25/13
73/204.15
6,539,968 B1 * 4/2003 White .................. G05D 7/0635
138/44
(Continued)

FOREIGN PATENT DOCUMENTS

| | | |
|---|---|---|
| CN | 1172304 A | 2/1998 |
| JP | 2004-257420 | 9/2004 |

(Continued)

OTHER PUBLICATIONS

International Search Report issued in International Patent Application No. PCT/JP2018/033583, dated Dec. 11, 2018, English translation.

(Continued)

*Primary Examiner* — Matthew W Jellett
(74) *Attorney, Agent, or Firm* — Greenblum & Bernstein, P.L.C.

(57) ABSTRACT

A valve device is capable of precisely adjusting a flow rate variation with time, aging, or the like without using an external sensor or using as few external sensors as possible.
(Continued)

The apparatus includes an adjusting actuator for adjusting the position of the operating member positioned at the open position, a communication unit for receiving adjustment information relating to the adjustment of the opening degree of the flow path by the valve element from the outside of the apparatus, and a control unit for adjusting the position of the operating member by driving the adjusting actuator based on the adjustment information.

9 Claims, 11 Drawing Sheets

(51) Int. Cl.
| | |
|---|---|
| *G01F 11/00* | (2006.01) |
| *G01F 15/06* | (2022.01) |
| *H01L 21/02* | (2006.01) |
| *F16K 31/04* | (2006.01) |
| *F16K 31/122* | (2006.01) |
| *F16K 31/48* | (2006.01) |

(52) U.S. Cl.
CPC ............ *G01F 15/066* (2013.01); *H01L 21/02* (2013.01); *F16K 31/047* (2013.01); *F16K 31/122* (2013.01); *F16K 31/48* (2013.01)

(58) Field of Classification Search
CPC ... F16K 37/00; C23C 16/45544; C23C 16/52; G05D 7/0635; G01F 15/005; G01F 15/066; G01F 11/006; H01L 21/02; H01L 21/67017
See application file for complete search history.

(56) References Cited

U.S. PATENT DOCUMENTS

| | | | |
|---|---|---|---|
| 8,210,022 B2* | 7/2012 | Moriya | G05D 7/0635 73/1.35 |
| 8,434,522 B2* | 5/2013 | Okase | F16K 27/003 137/884 |
| 8,594,852 B2* | 11/2013 | Alstrin | F15B 21/08 700/282 |
| 9,383,758 B2* | 7/2016 | Ohmi | G01F 7/005 |
| 9,625,047 B2* | 4/2017 | Hirose | F16K 27/0236 |
| 9,797,520 B2* | 10/2017 | Ohtsuki | F16K 31/007 |
| 10,679,880 B2* | 6/2020 | Penley | H01L 21/67253 |
| 11,003,198 B2* | 5/2021 | Mudd | G05D 7/0641 |
| 11,209,298 B2* | 12/2021 | Smirnov | G01F 25/15 |
| 2005/0253100 A1* | 11/2005 | Yasue | F16K 7/17 251/63 |

FOREIGN PATENT DOCUMENTS

| | | |
|---|---|---|
| JP | 2007-64333 | 3/2007 |
| JP | 2016-121776 | 7/2016 |
| WO | 2004/079243 | 9/2004 |

OTHER PUBLICATIONS

International Preliminary Report on Patentability issued in International Patent Application No. 31, 2020, English translation.
Chinese Office Action, Chinese Patent Office, Application No. 201880062421.3, dated Jun. 3, 2021.

* cited by examiner

[fig.1]
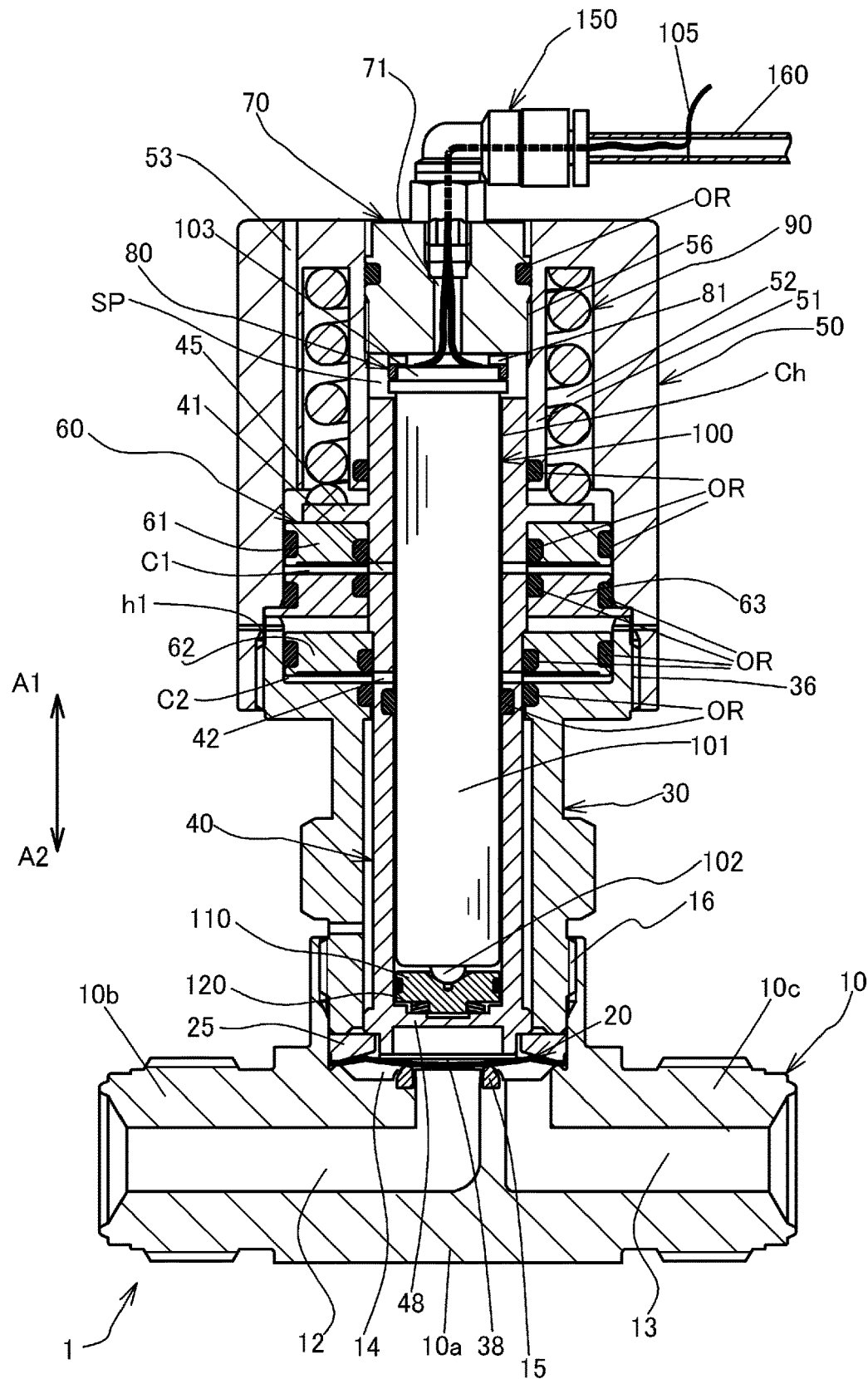

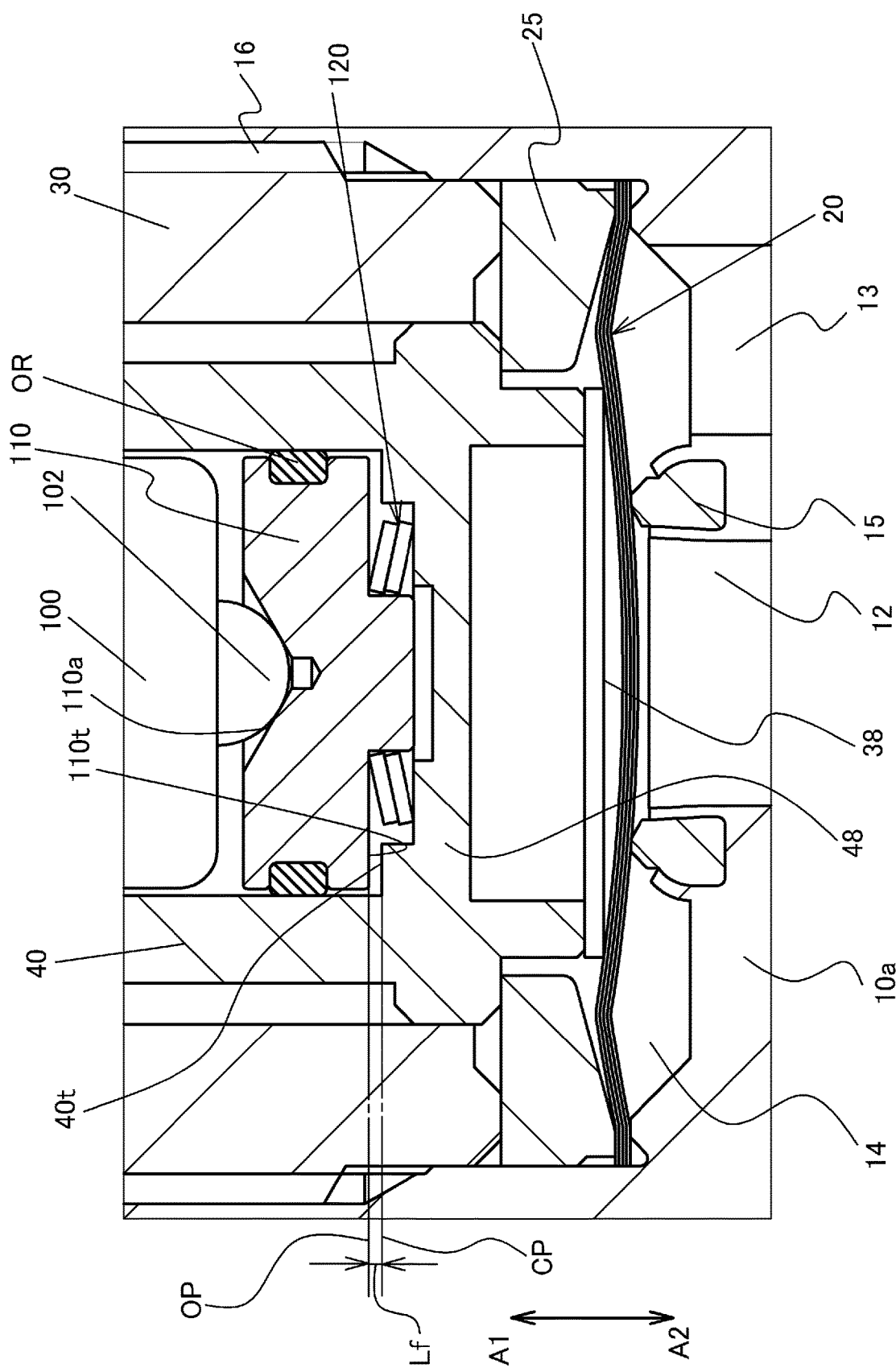

[fig.3]
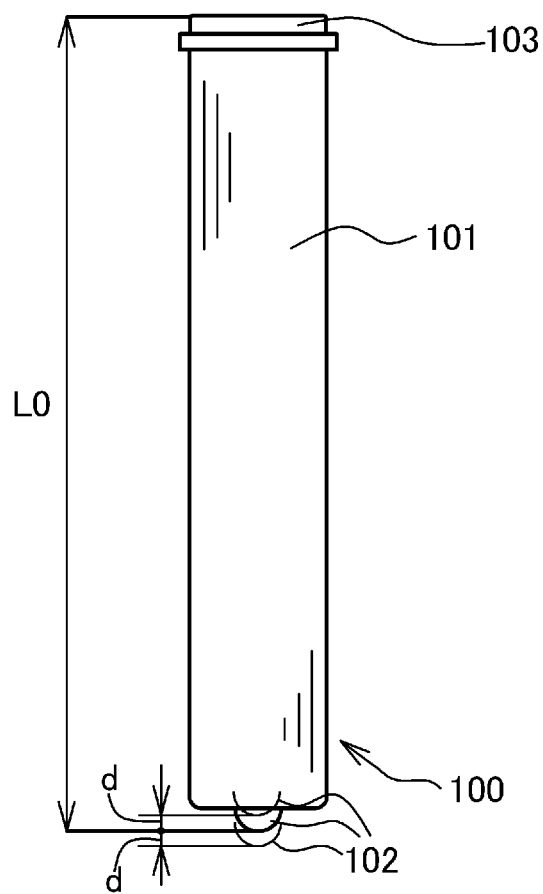

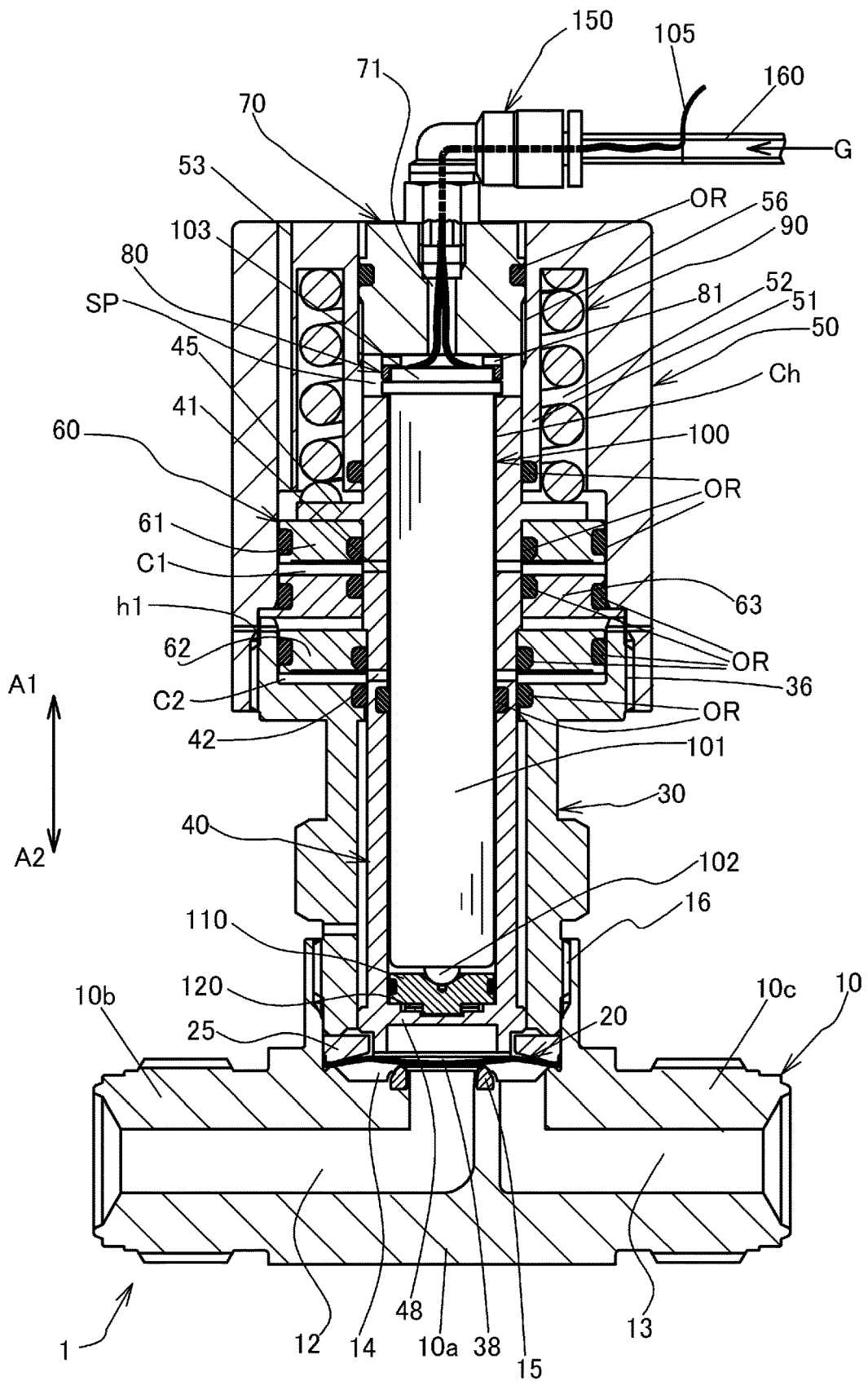
[fig.4]

[fig.5]
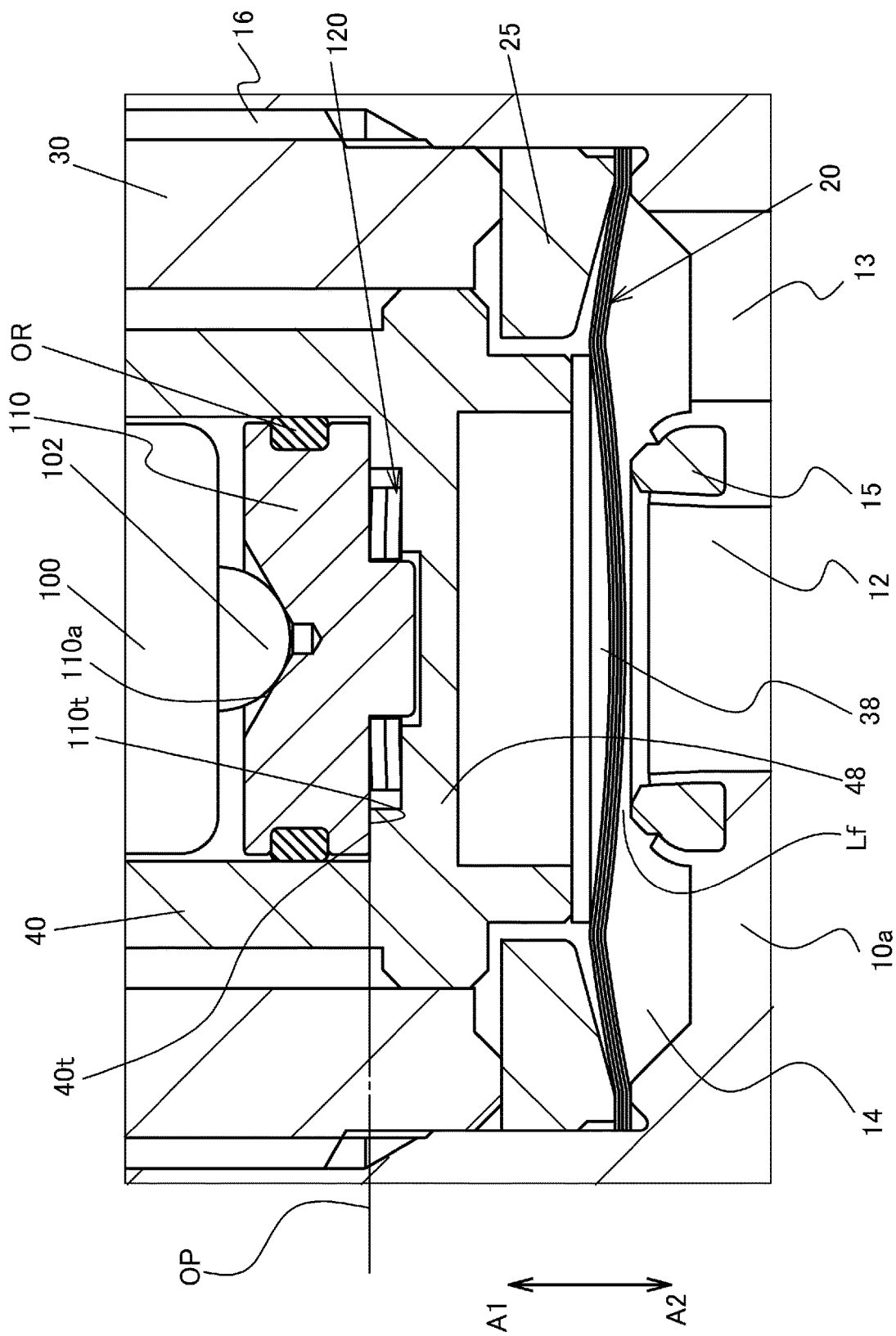

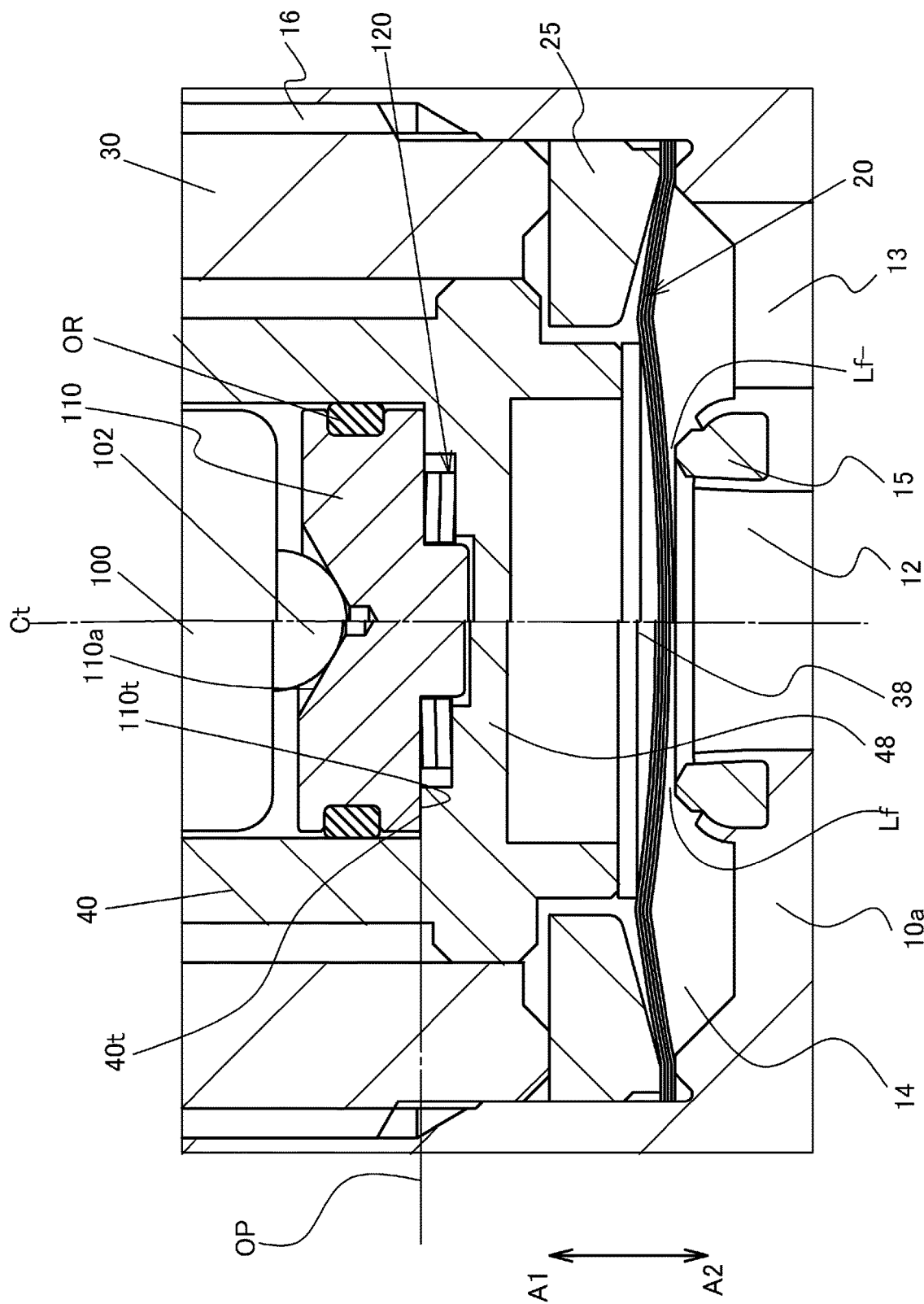
[fig.6A]

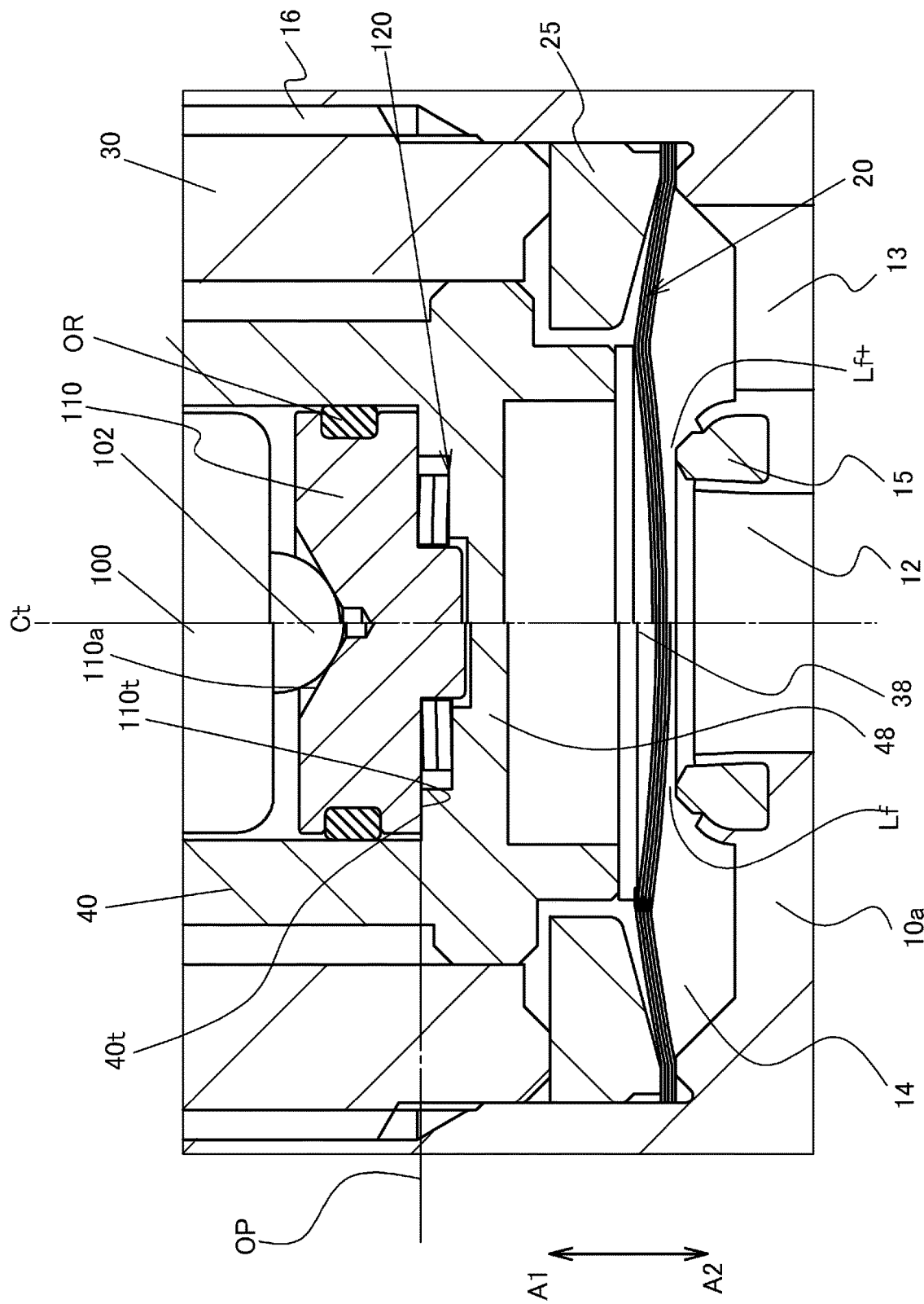
[fig.6B]

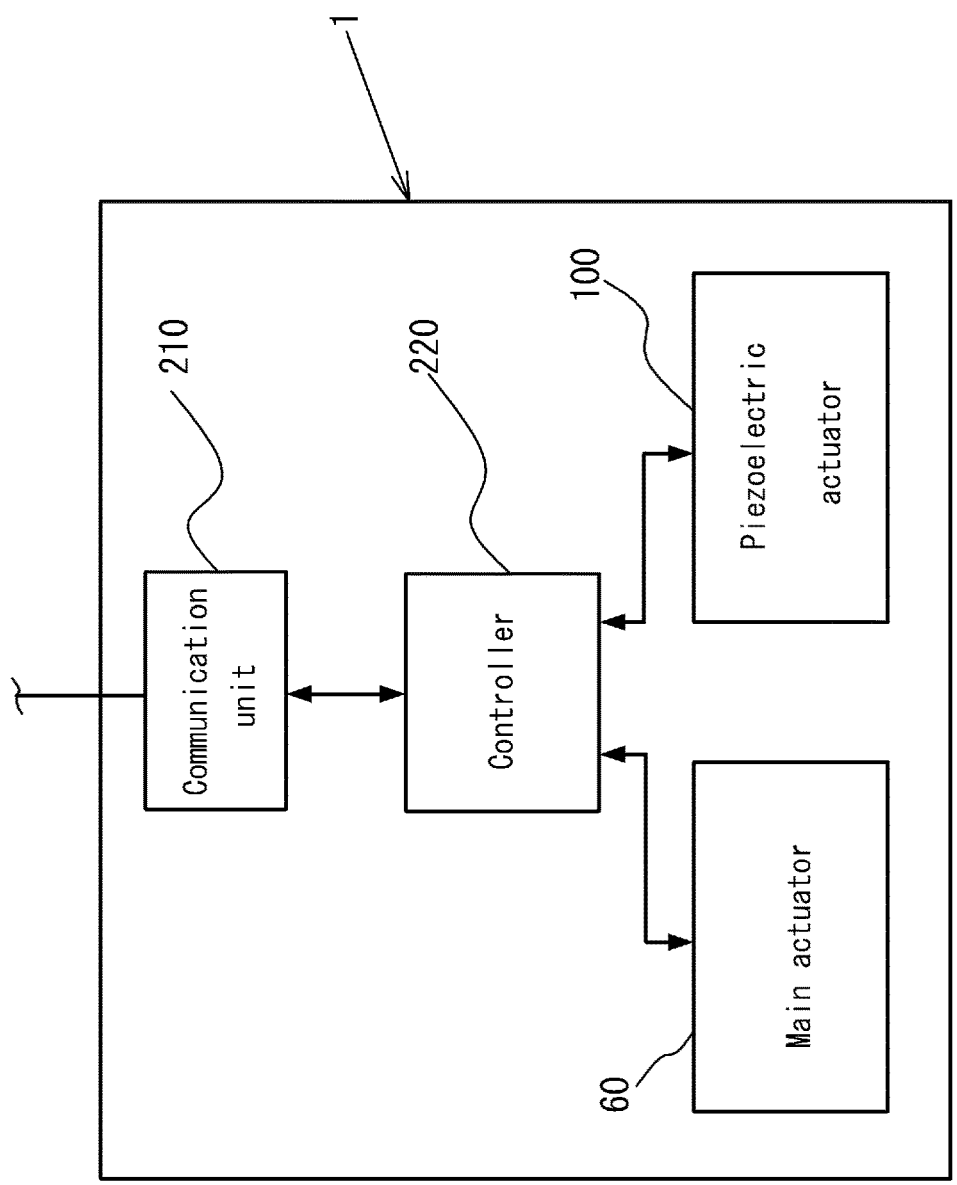
[fig.7]

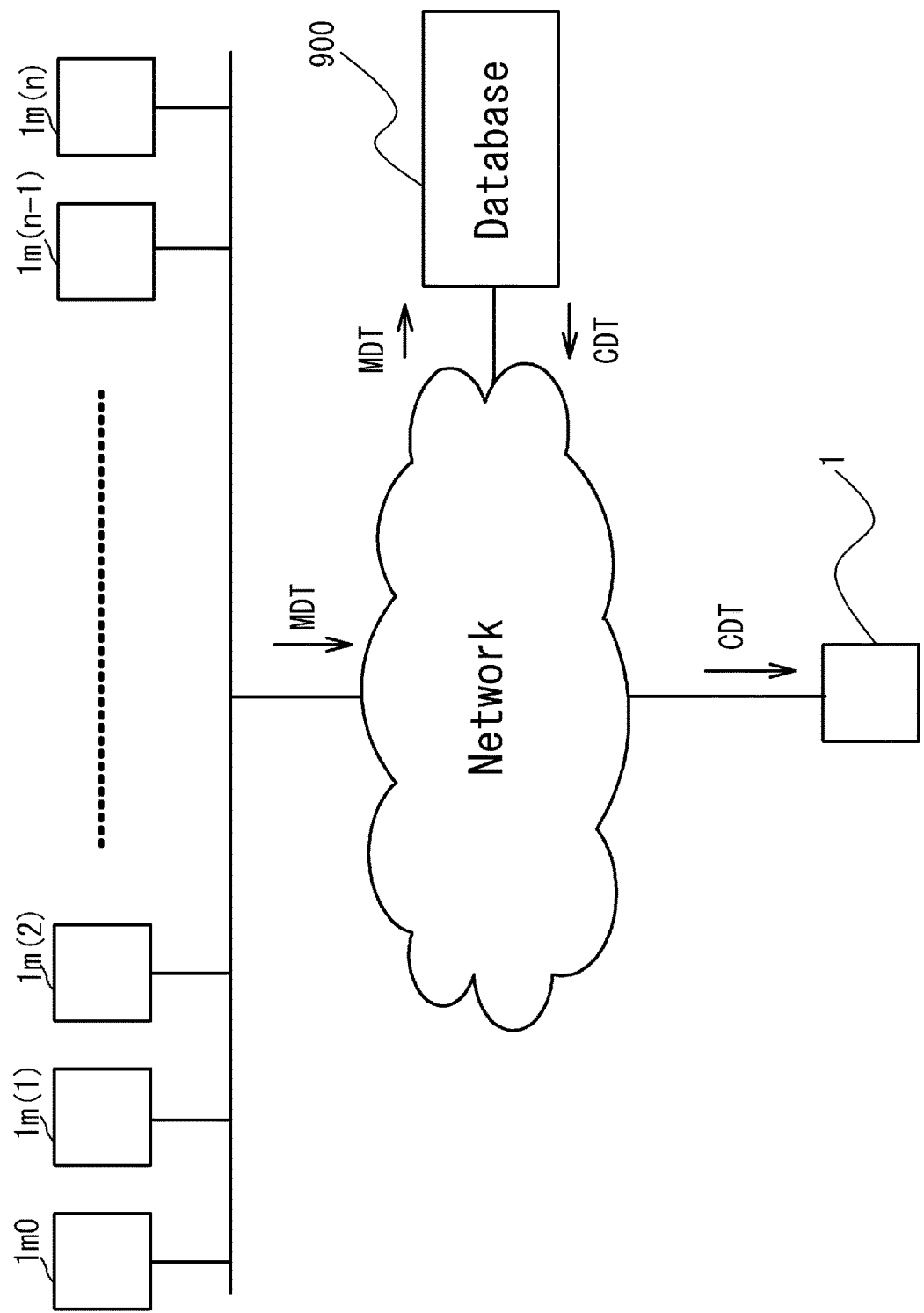
[fig.8]

[fig.9]
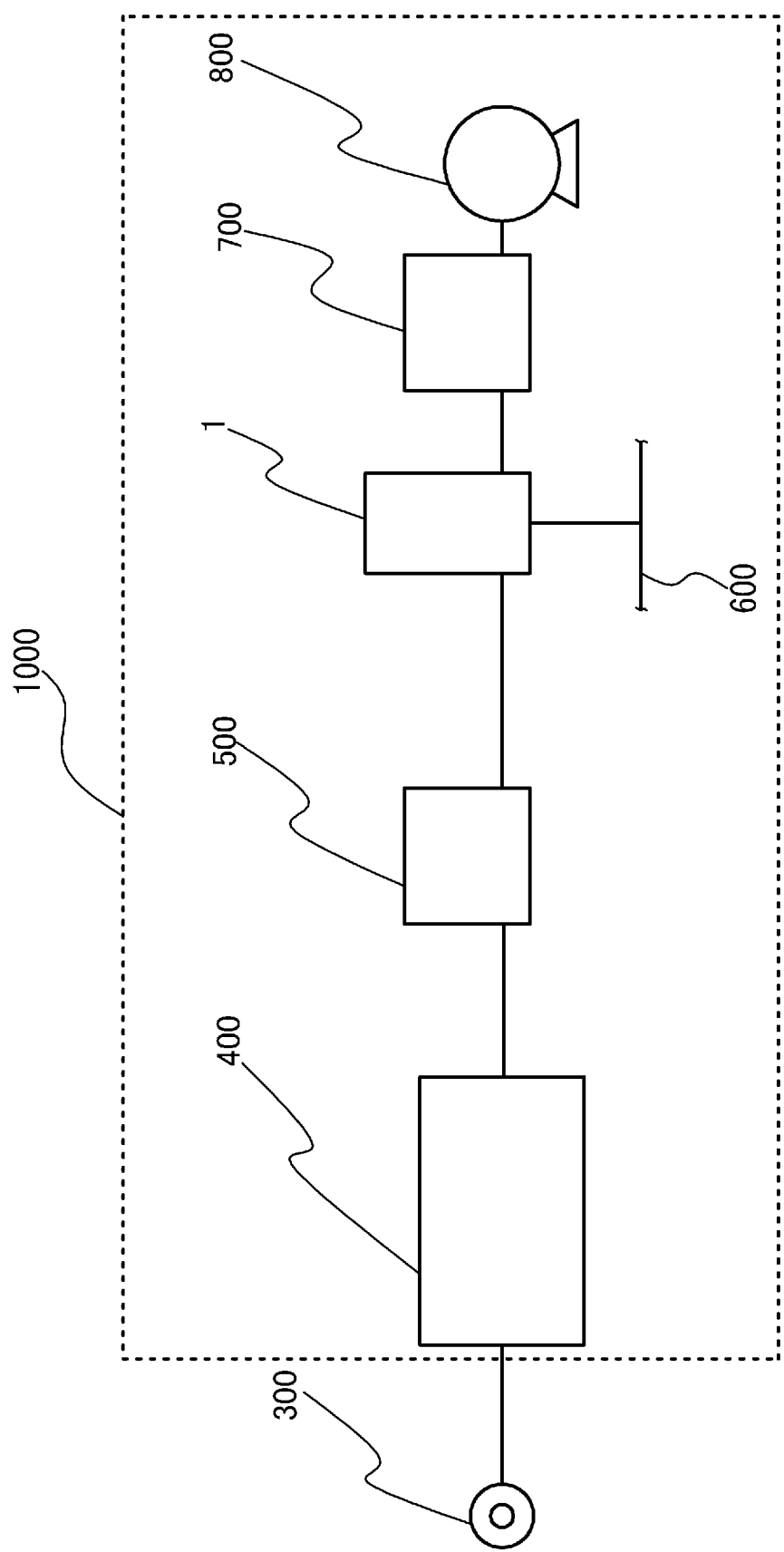

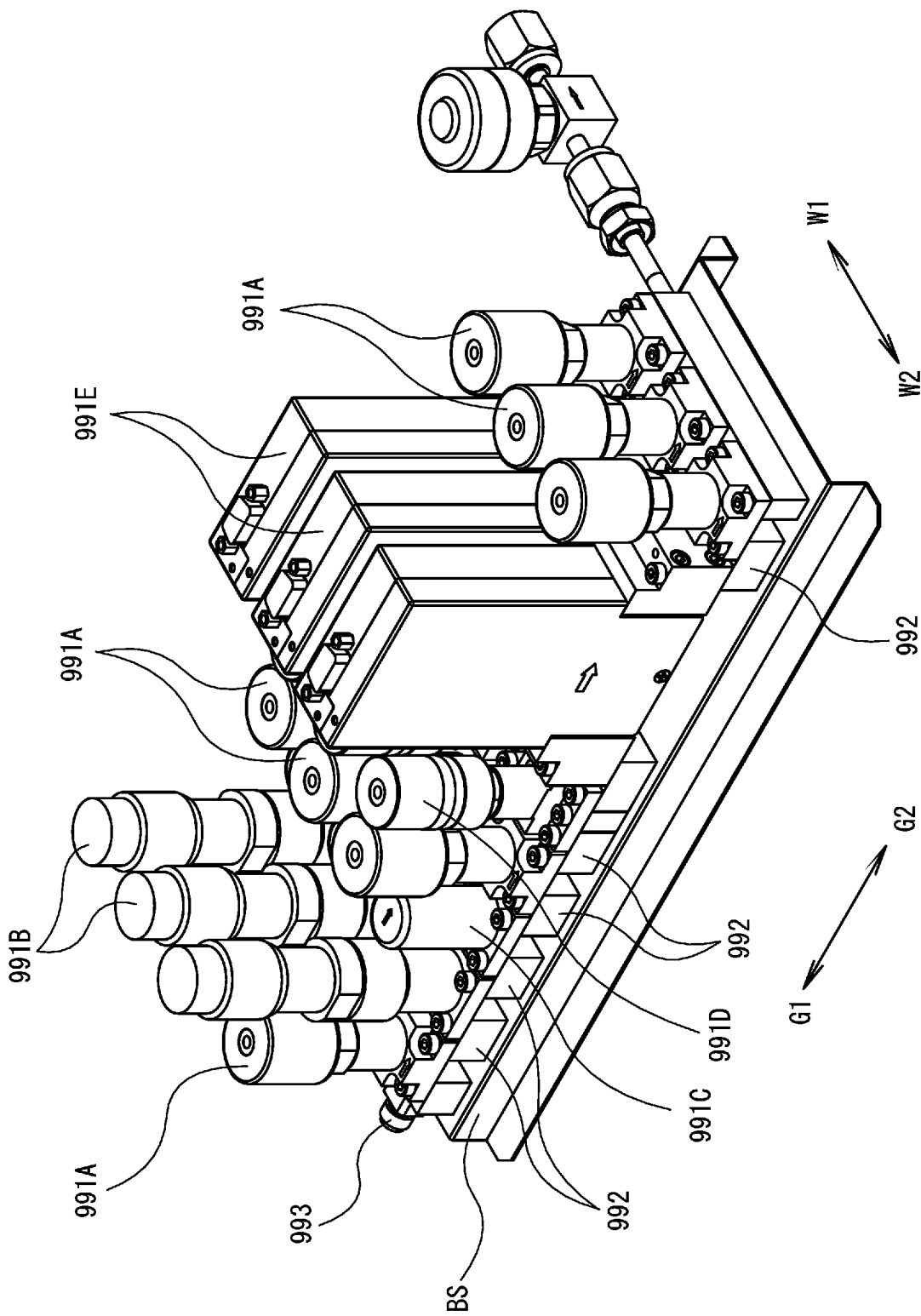

VALVE DEVICE, ADJUSTMENT INFORMATION GENERATING METHOD, FLOW RATE ADJUSTING METHOD, FLUID CONTROL SYSTEM, FLOW RATE CONTROL METHOD, SEMICONDUCTOR MANUFACTURING SYSTEM AND SEMICONDUCTOR MANUFACTURING METHOD

TECHNICAL FIELD

The present invention relates to a valve device, a method for generating adjustment information of the valve device, a flow rate adjustment method, a fluid control device, a flow rate control method, a semiconductor manufacturing apparatus, and a semiconductor manufacturing method.

BACKGROUND ART

In a semiconductor manufacturing process, a fluid control system called an integrated gas system in which various fluid control devices such as an open-close valve, a regulator, a mass flow controller, are integrated is used in order to supply an accurately metered processing gas to a processing chamber. This integrated gas system housed in a box is called a gas box.

Usually, the processing gas outputted from the gas box described above is directly supplied to the processing chamber, but in a process of depositing a film on a substrate by an atomic layer deposition (ALD: Atomic Layer Deposition) method, in order to stably supply the processing gas, the processing gas supplied from the gas box is temporarily stored in a tank as a buffer, and a valve provided in the immediate vicinity of the processing chamber is frequently opened and closed to supply the processing gas from the tank to the processing chamber in a vacuum atmosphere. Note that, for example of the valve provided close to the processing chamber, refer to Patent Documents 1 and 2.

The ALD method is one of chemical vapor deposition methods, in which two or more types of processing gases are alternately flowed on the substrate surface under film forming conditions such as temperature and time to react with atoms on the substrate surface to deposit a film layer by layer, and since every monoatomic layer can be controlled, a uniform film thickness can be formed and a film can be grown very densely in terms of film quality.

In the semiconductor manufacturing process by the ALD method, it is necessary to precisely adjust the flow rate of the processing gas, and it is also necessary to secure a certain amount of flow rate of the processing gas by increasing the diameter of the substrate or the like.

PATENT LITERATURE

PTL 1: Japanese Laid-Open Patent Application No. 2007-64333
PTL 2: Japanese Laid-Open Patent Application No. 2016-121776

SUMMARY OF INVENTION

Technical Problem

However, in an air-driven valve, it is not easy to precisely adjust the flow rate by pneumatic adjustment or mechanical adjustment. In addition, in the semiconductor manufacturing process based on ALD method, since the periphery of the processing chamber becomes high temperature, and thus the valve is susceptible to temperature. Further, since the valve is opened and closed at high frequency, and thus the valve readily ages and changes over time, requiring significant man-hours for the flow rate adjustment task.

In addition, in order to detect a change in the valve opening degree due to aging for each valve device using a sensor, it is necessary to secure a space in which the sensor is installed, and there are also problems such as difficulty in miniaturization of the valve device and high cost of the valve device.

An object of the present invention is to provide a valve device capable of precisely adjusting a flow rate variation with time, age, or the like without using an external sensor or using as few external sensors as possible.

Another object of the present invention is to provide a valve device capable of drastically reducing the number of steps required for flow rate adjustment.

Still another object of the present invention is to provide a flow rate adjusting method, a fluid control system, a semiconductor manufacturing system, and a semiconductor manufacturing method using the above valve device.

Yet another object of the present invention to provide a method and apparatus for generating adjustment information for the valve system described above.

Solution to Problem

The valve device according to the present invention comprises:
a valve body defining a flow path;
a valve element provided so as to be able to open and close a flow path of the valve body;
an operating member that operates the valve element and is movably provided between a closed position for making the valve element close the flow path and an open position for making the valve element close the flow path;
an adjusting actuator for adjusting the position of the operating member positioned in the open position;
a communication unit that receives adjustment information relating to the adjustment of the opening degree of the flow path by the valve element from the outside of the apparatus; and a control unit for driving the adjustment actuator to control the position of the operation member based on the adjustment information.

Preferably, the adjustment information includes information for specifying an opening degree adjustment amount.

Further preferably, the adjustment information includes information for specifying a timing at which the opening degree adjustment is performed.

The adjustment information generating method of the present invention is an adjustment information generating method for generating the adjustment information for the valve device, which comprises:
Accumulating measurement information related to a plurality of valve apparatuses to be measured, the measurement information being obtained by measuring environmental factors and flow rate changes, the environmental factors affecting changes of mechanical properties over time; and
generating adjustment information related to the opening degree adjustment of the valve element of the valve device.

The adjustment information generating apparatus according to the present invention is an adjustment information generating apparatus for generating the adjustment information for the valve device and comprises;
a storage unit for accumulating measurement information related to a plurality of valve apparatuses to be measured, the measurement information being obtained by measuring environmental factors and flow rate changes, the environmental factors affecting changes of mechanical properties over time; and a generator for generating adjustment information related to an opening degree adjustment of a valve element of the valve device using the measurement information accumulated in the storage device.

The flow rate adjusting method of the present invention is a flow rate adjusting method of the above-mentioned valve device, comprising:

receiving adjustment information relating to the adjustment of the opening degree of the flow path by the valve element from the outside of the apparatus, and driving the adjustment actuator to adjust the position of the operation member based on the received adjustment information.

The fluid control device according to the present invention is a fluid control device comprising a plurality of fluid devices arranged from an upstream side toward a downstream side, wherein the plurality of fluid devices include the above-mentioned valve device.

The flow rate control method of the present invention is a flow rate control method for controlling the flow rate of a fluid by using the above-mentioned valve device.

The semiconductor manufacturing method of the present invention comprises using the above-mentioned valve device for controlling the flow rate of the process gas in a manufacturing process of a semiconductor device requiring a process step using a process gas in a sealed chamber.

The semiconductor manufacturing apparatus of the present invention comprises a fluid control device for supplying a process gas to a processing chamber, the fluid control device includes a plurality of fluid devices, and the fluid device includes the valve device as described above.

Advantageous Effects of Invention

According to the present invention, the external sensor for detecting the flow rate can be omitted and the number of steps for flow rate adjustment can be greatly reduced by driving and controlling the adjustment actuator using the adjustment information provided from the outside of the apparatus through the communication unit.

According to the present invention, since the flow rate adjustment and the flow rate control can be performed by giving a command to the adjustment actuator through the communication unit, the flow rate can also be controlled in real time by the adjustment actuator.

According to the present invention, by providing the adjustment information to the adjustment actuator through the communication unit, it is possible to form the optimum adjustment information from a wide variety of measurement data obtained from other valve devices called so-called big data, and to optimally control the adjustment actuator.

According to the present invention, since the process gas supplied to the processing chamber can be controlled more precisely, a high-quality film can be stably formed on the substrate.

BRIEF DESCRIPTION OF DRAWINGS

FIG. 1 is a longitudinal cross-sectional view of a valve device according to an embodiment of the present invention.

FIG. 2 is an enlarged cross-sectional view of a main part of the valve device of FIG. 1 in a closed state.

FIG. 3 is an explanatory drawing illustrating the operation of the piezoelectric actuator.

FIG. 4 is a longitudinal cross-sectional view of the valve assembly of FIG. 1 in an open condition.

FIG. 5 is an enlarged cross-sectional view of a main part of the valve device of FIG. 4.

FIG. 6A is an enlarged cross-sectional view of a main part for explaining a state during flow adjustment (during flow rate decrease) of the valve device in FIG. 4.

FIG. 6B is an enlarged cross-sectional view of a main part for explaining a state during flow adjustment (during flow rate increase) of the valve device in FIG. 4.

FIG. 7 is a functional block diagram of the valve device of FIG. 1.

FIG. 8 is a schematic diagram of the valve device of FIG. 1 connected to a network.

FIG. 9 is a schematic drawing illustrating an application example of the valve device according to an embodiment of the present invention to a semiconductor manufacturing process.

FIG. 10 is a perspective view illustrating an example of a fluid control device using the valve device of the present embodiment.

DESCRIPTION OF EMBODIMENT

Embodiments of the present invention are described below with reference to the drawings. Now that, in the present specification and the drawings, components having substantially the same function are denoted using the same reference numerals, and duplicate descriptions thereof is omitted.

FIG. 1 is a drawing illustrating a configuration of a valve device according to an embodiment of the present invention, and shows the state when the valve is fully closed, FIG. 2 is an enlarged cross-sectional view of a main part of FIG. 1, and FIG. 3 is a drawing for explaining an operation of a piezoelectric actuator as an adjustment actuator. It should be noted that, in the following description, an upward direction is denoted as an opening direction A1 and a downward direction is denoted as a closing direction A2.

In FIG. 1, 1 denotes a valve device, 10 denotes a valve body, 20 denotes a diaphragm as a valve element, 38 denotes a diaphragm presser, 30 denotes a bonnet, 40 denotes an operating member, 50 denotes a casing, 60 denotes a main actuator, 70 denotes an adjustment body, 80 denotes an actuator presser, 90 denotes a coil spring, 100 denotes a piezoelectric actuator as an adjusting actuator, 110 denotes an actuator receiver, 120 denotes a disk spring as an elastic member, and OR denotes an O-ring as a seal member.

The valve body 10 is made of stainless steel and has a block-shaped valve body main portion 10a and connecting portions 10b and 10c protruding from the respective sides of the valve body main portion 10a, and defines flow paths 12 and 13. One end of each of the flow paths 12 and 13 opens at a respective end surface of the connecting portions 10b and 10c, and the other end communicates with a valve chamber 14 having a recessed shape opened upward. A valve seat 15 made of a synthetic resin (such as perfluoroalkoxy alkane (PFA), polyamide (PA), polyimide (PI), or polychlorotrifluoroethylene (PCTFE), or the like) is fitted and fixed to a mounting groove provided around a port of the other end side of the flow path 12 on the bottom surface of the valve chamber 14. Now that, in the present embodiment, as is clear from FIG. 2, the valve seat 15 is fixed in the mounting groove by swaging.

The diaphragm 20 is a valve element provided so as to be able to open and close the flow paths 12 and 13 of the valve body 10, is arranged above the valve seat 15, holds the air-tightness of the valve chamber 14, and opens and closes the flow paths 12 and 13 when the central portion thereof moves up and down to be seated on and off the valve seat 15. In the present embodiment, the diaphragm 20 has a spherical shell shape in which an upward convex arc shape in natural state formed by swelling upward a central portion of a metal thin plate such as special stainless steel or the like and a nickel-cobalt alloy thin plate. Three such special stainless steel sheets and one nickel-cobalt alloy sheet are laminated to form a diaphragm 20.

The diaphragm 20 is mounted on a protruding portion of the inner peripheral surface of the valve chamber 14 at its peripheral edge portion, and is pressed toward the protruding portion side of the valve body 10 through the pressing adapter 25 made of stainless alloy by inserting the lower end portion of the bonnet 30 into the valve chamber 14 and screwing the lower end portion with the screw portion 16 of the valve body 10, and is clamped and fixed in an airtight state. The nickel-cobalt alloy thin film is disposed on the gas contact side.

It should be noted that other configurations of the diaphragm can be used.

The operating member 40 is a member for operating the diaphragm 20 so as to open and close the flow paths 12 and 13 to the diaphragm 20, and is formed in a substantially cylindrical shape, closed at its lower end by the closing part 48, opened at its upper end, fitted to the inner peripheral surface of the bonnet 30 and the inner peripheral surface of the cylindrical portion 51 formed in the casing 50, and supported movably in the vertical direction. Note that A1 and A2 shown in FIG. 1 and FIG. 2 indicate the opening and closing directions of the operating member 40, A1 indicates the opening direction, and A2 indicates the closing direction. In the present embodiment, the upward direction is the opening direction A1 and the downward direction is the closing direction A2 with respect to the valve body 10, but the present invention is not limited thereto.

A diaphragm presser 38 made of a synthetic resin such as polyimide and abutting on the upper surface of the central portion of the diaphragm 20 is mounted on the lower end surface of the operating member 40.

A coil spring 90 is provided between the upper surface of the flange portion 45 formed on the outer peripheral surface of the operating member 40 and the ceiling surface of the casing, and the operating member 40 is constantly biased in the closing direction A2 by the coil spring 90. Therefore, as shown in FIG. 2, in a state in which the main actuator 60 is not operated, the diaphragm 20 is pressed against the valve seat 15, and the gateway between the flow paths 12 and 13 is closed.

The flange portion 45 may be integral with or separate from the operating member 40.

The coil spring 90 is accommodated in a holding portion 52 formed between the inner peripheral surface of the casing 50 and the cylindrical portion 51. In the present embodiment, the coil spring 90 is used, but the present invention is not limited thereto, and other types of springs such as a disk spring and a leaf spring can be used.

The casing 50 is fixed to the bonnet 30 by screwing the inner periphery of the lower end portion thereof into a screw portion 36 formed on the outer periphery of the upper end portion of the bonnet 30. An annular bulkhead 63 is fixed between the upper end surface of the bonnet 30 and the casing 50.

Cylinder chambers C1 and C2 vertically partitioned by a bulkhead 63 are formed between the outer peripheral surface of the operating member 40 and the casing 50 and the bonnet 30.

A piston 61 formed in an annular shape is fitted and inserted into the upper cylinder chamber C1, and a piston 62 formed in an annular shape is fitted and inserted into the lower cylinder chamber C2. The cylinder chambers C1 and C2 and the pistons 61 and 62 constitute a main actuator 60 for moving the operating member 40 in the opening direction A1. The main actuator 60 is configured so that the force by the operating gas can be increased by increasing the working area of the pressure using the two pistons 61 and 62.

The space above the piston 61 of the cylinder chamber C1 is connected to the atmosphere by the air passage 53. The space above the piston 62 of the cylinder chamber C2 is connected to the atmosphere by the air passage h1.

Since high-pressure operating gas is supplied to the space below the pistons 61 and 62 of the cylinder chambers C1 and C2, the O-ring OR maintains airtightness. These spaces communicate with the flow passages 41 and 42 formed in the operating member 40, respectively. The flow passages 41 and 42 communicate with a flow passage Ch formed between the inner peripheral surface of the operating member 40 and the outer peripheral surface of the case body 101 of the piezoelectric actuator 100, and the flow passage Ch communicates with a space SP formed by the upper end surface of the operating member 40, the cylindrical portion 51 of the casing 50, and the lower end surface of the adjustment body 70. The flow passage 81 formed in the annular actuator presser 80 connects the space SP and the flow passage 71 passing through the center of the adjustment body 70. The flow passage 71 of the adjustment body 70 communicates with the pipe 160 via the pipe fitting 150.

The piezoelectric actuator 100 incorporates a laminated piezoelectric element (not shown) in a cylindrical case body 101 shown in FIG. 3. The case body 101 is made of a metal such as a stainless steel alloy, and the end surface on the side of the hemispherical fore-end portion 102 and the end surface on the side of the base end portion 103 are closed. By applying a voltage to the laminated piezoelectric element and extending it, the end surface of the case body 101 on the side of the fore-end portion 102 is elastically deformed, and the hemispherical fore-end portion 102 is displaced in the longitudinal direction. Assuming that the largest stroke of the stacked piezoelectric elements is 2d, the total length of the piezoelectric actuator 100 becomes L0 by previously applying a predetermined voltage V0 at which the elongation of the piezoelectric actuator 100 becomes d. When a voltage higher than the predetermined voltage V0 is applied, the total length of the piezoelectric actuator 100 becomes L0+d at the maximum, and when a voltage (including no voltage) lower than the predetermined voltage V0 is applied, the total length of the piezoelectric actuator 100 becomes L0−d at the minimum. Therefore, it is possible to expand and contract the entire length from the fore-end portion 102 to the base end portion 103 in the opening and closing directions A1 and A2. In the present embodiment, the fore-end portion 102 of the piezoelectric actuator 100 is hemispherical, but the present invention is not limited thereto, and the fore-end portion may be a flat surface.

As shown in FIG. 1, power is supplied to the piezoelectric actuator 100 by a wiring 105. The wiring 105 is led through the flow passage 71 of the adjustment body 70 and the pipe fitting 150 to the pipe 160, and is led out to the outside from the middle of the pipe 160.

The position of the base end portion 103 of the piezoelectric actuator 100 in the opening/closing direction is defined by the lower end surface of the adjustment body 70 via the actuator presser 80. In the adjustment body 70, a screw portion provided on the outer peripheral surface of the adjustment body 70 is screwed into the screw hole 56 formed in the upper portion of the casing 50, and the positions of the opening and closing directions A1 and A2 of the piezoelectric actuator 100 can be adjusted by adjusting the positions of the opening and closing directions A1 and A2 of the adjustment body 70.

As shown in FIG. 2, the fore-end portion 102 of the piezoelectric actuator 100 abuts against a conical receiving surface 110a formed on the upper surface of the disk-shaped actuator receiver 110. The actuator receiver 110 is movable in the opening and closing directions A1 and A2.

Between the lower surface of the actuator receiver 110 and the upper surface of the blocking portion 48 of the operation member 40, a disk spring 120 as an elastic member is provided. In the state shown in FIG. 2, the disk spring 120 is already compressed to some extent and elastically deformed, and the actuator receiver 110 is constantly urged in the opening direction A1 by the restoring force of the disk spring 120. As a result, the piezoelectric actuator 100 is also constantly urged in the opening direction A1, and the upper surface of the base end portion 103 is pressed against the actuator presser 80. Thus, the piezoelectric actuator 100 is disposed at a predetermined position with respect to the valve body 10. Since the piezoelectric actuator 100 is not connected to any member, it is relatively movable in the opening and closing direction A1, A2 with respect to the operating member 40.

The number and orientation of the disk springs 120 can be appropriately changed according to conditions. In addition, other elastic members such as a coil spring and a leaf spring can be used in addition to the disk spring 120, but the use of the disk spring has an advantage that the spring rigidity, the stroke, and the like can be easily adjusted.

As shown in FIG. 2, in a state in which the diaphragm 20 abuts against the valve seat 15 and the valve is closed, a gap is formed between the regulating surface 110t on the lower surface side of the actuator receiver 110 and the abutting surface 40t on the upper surface side of the blocking portion 48 of the operating member 40. The distance of this gap corresponds to the lift amount Lf of the diaphragm 20. The lift amount Lf defines the opening degree of the valve, that is, the flow rate. The lift amount Lf can be changed by adjusting the positions in the opening and closing directions A1 and A2 of the adjustment body 70. The operating member 40 in the state shown in FIG. 2 is positioned at the closed position CP with reference to the abutting surface 40t. When the abutting surface 40t moves to a position where it abuts the regulating surface 110t of the actuator receiver 110, that is, to the open position OP, the diaphragm 20 is separated from the valve seat 15 by the lift amount Lf.

Next, the operation of the valve device 1 having the above-described configuration will be described by referring to FIGS. 4 to 6B.

As shown in FIG. 4, when the operation gas G having a predetermined pressure is supplied into the valve device 1 through the pipe 160, a thrust force for pushing the piston 61, 62 upward in the opening direction A1 acts on the operating member 40. The pressure of the operating gas G is set to a value sufficient to move the operating member 40 in the opening direction A1 against the urging force in the closing direction A2 acting on the operating member 40 from the coil spring 90 and the disk spring 120. When such an operating gas G is supplied, as shown in FIG. 5, the operating member 40 moves in the opening direction A1 while further compressing the disk spring 120, the abutting surface 40t of the operating member 40 abuts on the regulating surface 110t of the actuator receiver 110, and the actuator receiver 110 receives a force from the operating member 40 toward the opening direction A1. This force acts as a force that compresses the piezoelectric actuator 100 in the opening and closing directions A1, A2 through the fore-end portion 102 of the piezoelectric actuator 100, but the piezoelectric actuator 100 has sufficient rigidity to resist this force. Therefore, the force in the opening direction A1 acting on the operating member 40 is received by the fore-end portion 102 of the piezoelectric actuator 100, and the movement of the operating member 40 in the A1 direction is restricted in the open position OP. In this state, the diaphragm 20 is separated from the valve seat 15 by the lift amount Lf described above.

When it is desired to adjust the flow rate of the fluid output and supplied through the flow path 13 of the valve device 1 in the state shown in FIG. 5, the piezoelectric actuator 100 is activated.

The left side of the center line Ct in FIGS. 6A and 6B shows a state shown in FIG. 5, and the right side of the center line Ct shows a state after the positions of the opening and closing directions A1 and A2 of the operating member 40 are adjusted.

When the flow rate of the fluid is adjusted in the decreasing direction, as shown in FIG. 6A, the piezoelectric actuator 100 is extended to move the operating member 40 in the closing direction A2. As a result, the lift amount Lf− after adjustment, which is the distance between the diaphragm 20 and the valve seat 15, becomes smaller than the lift amount Lf before adjustment.

When the flow rate of the fluid is adjusted in the increasing direction, the piezoelectric actuator 100 is shortened to move the operating member 40 in the opening direction A1 as shown in the FIG. 6B. As a result, the lift amount Lf+ after adjustment, which is the distance between the diaphragm 20 and the valve seat 15, becomes larger than the lift amount Lf before adjustment.

In the present embodiment, the maximum value of the lift amount of the diaphragm 20 is about 100 to 200 μm, and the adjustment amount by the piezoelectric actuator 100 is about ±20 μm.

That is, the stroke of the piezoelectric actuator 100 cannot cover the lift amount of the diaphragm 20, but by using the main actuator 60 operated by the operating gas G and the piezoelectric actuator 100 in combination, the flow rate can be precisely adjusted by the piezoelectric actuator 100 having a relatively short stroke while securing the flow rate supplied by the valve device 1 by the main actuator 60 having a relatively long stroke, and the flow rate need not be manually adjusted by the adjustment body 70 or the like, so that the number of steps for flow rate adjustment is greatly reduced.

According to the present embodiment, precise flow rate adjustment is possible only by changing the voltage applied to the piezoelectric actuator 100, so that flow rate adjustment can be immediately performed and flow rate control can also be performed in real time.

Automatic Flow Adjustment

In the above embodiment, when adjusting the flow rate, it is assumed that the flow rate adjustment amount (lift amount) is known in advance.

However, the mechanical characteristics of the components such as the diaphragm 20, the disk spring 120, and the coil spring 90, which constitute the valve device 1, change in accordance with the opening/closing frequency and the operating period of the valve device 1. For example, when the restoring force at the initial stage of the diaphragm 20 is compared with the restoring force after the diaphragm 20 has been used for a long period of time, the restoring force at the initial stage is larger. Therefore, when the opening and closing operation of the valve device 1 is repeated for a long period of time, the flow rate deviates from the preset flow rate due to the gradual change in the mechanical characteristics of the components described above.

In a valve device which has been miniaturized and integrated, it is impractical to provide an external sensor or the like for monitoring the fluctuation of the flow rate, and the cost of such device becomes high.

FIG. 7 is a functional block diagram of a drive control system of the main actuator 60 and the piezoelectric actuator 100 of the valve device 1 according to the present embodiment.

The drive control system of the main actuator 60 and the piezoelectric actuator 100 includes a communication unit 210 and a control unit 220.

The communication unit 210 is formed to be connectable to a network line such as a LAN (Local Area Network) by wire or radio, and can exchange various data with the outside of the valve device 1. The information received through the communication unit 210 includes adjustment information for adjusting the opening degree (lift amount) of the diaphragm 20. The adjustment information includes data indicating the lift amount of the diaphragm 20 and a timing signal for adjusting the opening degree of the diaphragm 20. The content of the data may be information for specifying the lift amount of the diaphragm 20 or the adjustment timing of the lift amount.

The control unit 220 is composed of hardware such as a microprocessor, a memory, and an amplifier, and necessary software, and receives information from the communication unit 210 to drive and control the main actuator 60 and the piezoelectric actuator 100.

As shown in FIG. 7, adjustment information for adjusting the opening degree (lift amount) of the diaphragm 20 is given from the network line through the communication unit 210, and the control unit 220 is caused to drive and control the piezoelectric actuator 100 based on this information, whereby the flow rate adjustment can be automated. What is important here is to acquire adjustment information that enables the opening degree (lift) of the diaphragm 20 to be adjusted with high accuracy.

Factors influencing the phenomenon that the mechanical characteristics of the valve device 1 change and deviate from the preset flow rate include the pressure of the internal fluid passing through the flow path, the physical properties (gas type) of the internal fluid, the temperature of the internal fluid, the pressure of the driving fluid for driving the main actuator 60, the number of times of opening and closing of the diaphragm 20, the opening and closing frequency, and the like. Further, there exists an individual difference between the plurality of valve devices 1 caused by a machining tolerance or the like at the time of machining, and this individual difference is also expected to be a factor that influences the aging of the mechanical characteristics of the valve device 1.

As an example of a method of acquiring adjustment information capable of returning to an initial value or a reference value by adjusting the opening degree (lift amount) of the diaphragm 20, for example, as shown in FIG. 8, for a plurality of valve devices $1m0$ to $1mn$ for measurement having the same specifications as those of the valve device 1, environmental factors and flow rate changes affecting aging of mechanical characteristic as described above are measured, and the measurement information MDT is fetched into the database 900 to form so-called big data. The measuring valve devices $1m0$ to $1mn$ may be disposed at respective adjacent positions, or may be disposed at respective distant positions. The measurements may also be performed simultaneously at the same location or at different times at different locations. The measurement may be carried out up to the opening and closing durability limit of the valve, (e.g., 10 million times). The measurement conditions of the valve devices $1m0$ to $1mn$ for measurement may be variously different, or the measurement may be performed under the same measurement conditions.

The database 900 accumulates enormous data over time.

In the database 900, the stored data is used to generate adjustment information CDT relating to the adjustment of the opening degree of the diaphragm 20 which is optimal for the valve device 1.

Information on the initial value or reference value of the lift amount (opening degree) of the diaphragm 20 at the time of manufacturing or shipment of the valve device 1 is registered in the database 900, and adjustment information (adjustment amount) for returning the lift amount (opening degree) to the initial value or reference value is generated in the database 900. The information on the initial value or the reference value of the lift amount of the diaphragm 20 may be registered in any location other than the database 900, or may be stored in the memory of the valve device 1. In this case, the database 900 accesses the memory of the valve device 1 through the network, and acquires data relating to an initial value or a reference value of the lift amount.

In the database 900, adjustment information CDT for correcting the deviation amount of the lift amount of the diaphragm 20 from the initial value or the reference value is generated.

From the adjustment information CDT, a more optimal opening degree adjustment amount and adjustment timing of the diaphragm 20 can be obtained.

It should be noted that the above-mentioned method of acquiring the adjustment information CDT is an example, and any method can be employed as long as it can acquire data preferable for adjusting the opening degree of the valve device 1. In the present embodiment, the valve devices $1m0$ to $1mn$ for measurement and the valve device 1 to be adjusted are separately divided, but the valve device 1 to be adjusted may be provided with a measuring device for environmental factors and flow rates.

Next, an application example of the valve device 1 described above will be described with reference to FIG. 9.

The system shown in FIG. 9 is a semiconductor manufacturing apparatus 1000 for executing a semiconductor manufacturing process by the ALD method, in which 300 denotes a process gas supply source, 400 denotes a gas box, 500 denotes a tank, 600 denotes a network, 700 denotes a processing chamber, and 800 denotes an exhaust pump.

In the semiconductor manufacturing process by the ALD method, it is necessary to precisely adjust the flow rate of the processing gas, and it is also necessary to secure a certain amount of flow rate of the processing gas by increasing the diameter of the substrate.

The gas box 400 is an integrated gas system (fluid control device) in which various fluid control devices such as an open-close valve, a regulator, and a mass flow controller are integrated and accommodated in the box in order to supply an accurately metered process gas to the processing chamber 700.

The tank 500 functions as a buffer for temporarily storing the processing gas supplied from the gas box 400.

The processing chamber 700 provides a sealed processing space for forming a film on a substrate by an ALD method.

The exhaust pump 800 draws a vacuum in the processing chamber 700.

According to the system configuration as described above, the initial adjustment of the processing gas becomes possible by sending a command or information for flow rate adjustment to the valve device 1 via the network 600.

In addition, the flow rate of the processing gas can be adjusted even during the film formation process in the processing chamber 700, and the flow rate of the processing gas can be optimized in real time.

In the above application example, the case where the valve device 1 is used in the semiconductor manufacturing process by the ALD method has been exemplified, but the present invention is not limited to this, and can be applied to any object requiring precise flow rate adjustment.

In the above embodiment, a piston incorporated in a cylinder chamber operated by gas pressure is used as the main actuator, but the present invention is not limited to this, and an optimum actuator can be variously selected according to a control target.

In the above embodiment, the piezoelectric actuator is used as the actuator for adjustment, but the present invention is not limited to this, and various actuators can be adopted, including a mechanism such as a motor such as a stepping motor combined with a ball screw and a nut that convert a rotational motion into a linear motion; a solenoid coil; and a thermo actuator that expands and contracts by a temperature change, and the like. The piezoelectric actuator 100 is preferable as an adjustment actuator of the present invention in that it emits little heat, has a heat resistance of a hundred and several dozen degrees Celsius, can be constantly operated not only at the time of initial adjustment but also during fluid control, has a very high positioning accuracy due to a small nonlinear characteristic such as backlash at the time of expansion and contraction, and can support a relatively large compressive load. In addition, if the open position OP of the operating member 40 is mechanically adjusted in advance with high accuracy by the adjustment body 70, the piezoelectric actuator 100 is caused to perform high-accuracy control of the position of the operating member 40 thereafter, so that the maximum stroke of the piezoelectric actuator 100 can be made as small as possible (the piezoelectric actuator can be miniaturized) and high-accuracy fine adjustment and high-accuracy position control of the position of the operating member 40 can be performed.

In the above embodiment, a so-called normally closed type valve is exemplified, but the present invention is not limited to this, and is also applicable to a normally open type valve. In this case, for example, the opening degree of the valve body may be adjusted by the adjusting actuator.

In the above embodiment, the piezoelectric actuator 100 is configured to support (receive) the force acting on the operating member 40, but the present invention is not limited to this, and it is also possible to mechanically position the operating member 40 at the open position OP and perform only the position adjustment of the operating member 40 in the open/close direction by the adjustment actuator without supporting the force acting on the operating member 40.

Although the diaphragm is exemplified as the valve element in the above embodiment, the present invention is not limited to this, and other types of valve elements may be employed.

An example of a fluid control device to which the valve device of the present invention is applied will be described with reference to FIG. 10.

The fluid control device shown in FIG. 10 is provided with a base plate BS made of metal, which is arranged along the width directions W1 and W2 and extends in the longitudinal directions G1 and G2. Note that W1 represents the front side, W2 represents the back side, G1 represents the upstream side, and G2 represents the downstream side. Various fluid devices 991A to 991E are installed on the base plate BS via a plurality of flow path blocks 992, and a flow path (not shown) through which a fluid flows from the upstream side G1 toward the downstream side G2 is formed by the plurality of flow path blocks 992.

Here, a "fluid device" is a device used in a fluid control device for controlling a flow of a fluid, and includes a body defining a fluid flow path, and has at least two flow path ports opening at a surface of the body. Specific examples include, but are not limited to, an open-close valve (two-way valve) 991A, a regulator 991B, a pressure gauge 991C, an open-close valve (three-way valve) 991D, a mass flow controller 991E, and the like. The introducing pipe 993 is connected to a flow passage port on the upstream side of the flow passage (not shown) described above.

The present invention can be applied to various valve devices such as the above-described open-close valves 991A and 991D and the regulator 991B.

In the above embodiment, the database 900 is exemplified as the adjustment information generating apparatus, but the present invention is not limited thereto, and measurement data may be accumulated in the database 900, and the generation of the adjustment information may be performed by another computer.

REFERENCE SIGNS LIST

1: Valve device
1*m*0: Valve for measuring
10: Valve body
10*a*: Valve body main portion
10*b*: Connecting portion
10*c*: Connecting portion
12: Flow path
13: Flow path
14: Valve chamber
15: Valve seat
16: Screw portion
20: Diaphragm
25: Pressing adapter
30: bonnet
36: Screw portion
38: Diaphragm presser
40: Operating member
40*t*: abutting surface
41: Flow passage
42: Flow passage
45: Flange portion
48: Closing part 50: Casing
51: Cylindrical part
52: Holding portion
53: Air passage
56: Screw hole
60: Main actuator
61: Piston
62: Piston
63: Bulkhead
70: Adjustment body
71: Flow passage
80: Actuator presser
81: Flow passage
90: Coil spring
100: Piezoelectric actuator
101: Case body
102: Fore-end portion
103: Base end
105: Wiring
110: Actuator receiver
110a: Receiving surface
110t: Regulating surface
120: Disk spring
150: Pipe fitting
160: Tube
210: Communication unit
220: Controller
400: Gas box
500: Tank
600: Network
700 Processing chamber
800: Exhaust pump
900: Database
991A: open-close valve
991B: Regulator
991C: Pressure gauge
991D: open-close valve
991E: Mass flow controller
992: Flow path block
993: Introduction tube
1000: Semiconductor manufacturing equipment
A1: Opening direction
A2: Closing direction
BS: base plate
C1: Cylinder chamber
C2: Cylinder chamber
CDT: Adjustment Information
CP: closed position
Ch: flow passage
Ct: central line
G: Operating gas
G1: Longitudinal direction (upstream)
G2: Longitudinal direction (downstream)
Lf+, Lf−: lift amount
MDT: Measurement information
OP: open position
OR: O-ring
SP: space
V0: predetermined voltage
W1, W2: Width direction
h1: Ventilation channel

The invention claimed is:

1. A valve device comprising:
a valve body defining a flow path;
a valve element provided so as to be configured to open and close the flow path of the valve body;
an operator structure that operates the valve element and is movably provided between a closed position that is to make the valve element close the flow path and an open position that is to make the valve element open the flow path;
an adjustment actuator that adjusts a position of the operator structure positioned in the open position;
a communication transmitter and receiver that receives adjustment information relating to an adjustment of an opening degree of the flow path by the valve element from an outside of the valve device, and the adjustment information received by the communication transmitter and receiver is based on measurement information obtained from a measurement on at least one measuring valve device that includes specifications that are the same as those of the valve device; and
a controller that drives the adjustment actuator to control the position of the operator structure based on the adjustment information.

2. The valve device according to claim 1, wherein the adjustment information includes information for specifying an opening degree adjustment amount.

3. The valve device according to claim 1, wherein the adjustment information includes information for specifying a timing at which the opening degree adjustment is performed.

4. The valve device according to claim 1, further comprising:
a main actuator that moves the operator structure to one of the open position or the closed position, and
a spring mechanism that moves the operator structure to another one of the open position and the closed position,
wherein the adjustment actuator adjusts the position of the operator structure positioned in the open position by the main actuator or the spring mechanism.

5. An adjustment information generating method for the valve device as claimed in claim 1, which comprises:
measuring environmental factors and flow rate changes of a plurality of measuring valve devices, the environmental factors affecting changes of mechanical properties of the plurality of measuring valve devices over time, to obtain measurement information based on the measuring;
accumulating the measurement information related to the plurality of measuring valve devices;
transmitting the measurement information over a network; and
receiving over the network with the communication transmitter and receiver, the adjustment information related to an opening degree adjustment of the valve element of the valve device, wherein the adjustment information is based on the accumulated measurement information.

6. The adjustment information generating method according to claim 5, wherein the adjustment information is based on information on an initial value or a reference value of the opening degree of the flow path.

7. An adjustment information generating apparatus for generating adjustment information for a valve device, comprising:
the valve device according to claim 1;
a plurality of measuring valve devices measured for environmental factors and flow rate changes of the plurality of measuring valve devices, the environmental factors affecting changes of mechanical properties of the plurality of measuring valve devices over time, to obtain measurement information that is based on measurement of the plurality of measuring valve devices; and a storage to accumulate the measurement information related to the plurality of measuring valve devices, wherein the communication transmitter and receiver of the valve device receives over a network the adjustment information related to an opening degree adjustment of the valve element of the valve device, the adjustment information being based on the measurement information accumulated in the storage.

8. The adjustment information generating apparatus as claimed in claim 7, wherein the adjustment information is based on information relating to an initial value or a reference value of the opening degree of the flow path.

9. The valve device according to claim 1, wherein the valve device is not provided with an external sensor to monitor a fluctuation of a flow rate through the flow path.

* * * * *